United States Patent [19]

Myers et al.

[11] Patent Number: 5,572,143
[45] Date of Patent: Nov. 5, 1996

[54] CIRCUIT TESTING DEVICE

[75] Inventors: Dean E. Myers, South Solon; James F. Mellott, Washington C. H., both of Ohio; Jeff Masterman, Bakersville, N.C.

[73] Assignee: MAC Tools, Inc., Washington Court House, Ohio

[21] Appl. No.: 138,711

[22] Filed: Oct. 19, 1993

[51] Int. Cl.$^6$ .................................................. G01R 31/02
[52] U.S. Cl. ............................................................ 324/555
[58] Field of Search ............................... 324/555, 133, 324/713, 556, 511, 705

[56] References Cited

U.S. PATENT DOCUMENTS

| | | | |
|---|---|---|---|
| 2,229,927 | 1/1941 | Kamper | 175/183 |
| 3,600,678 | 8/1971 | Garrett | 324/133 |
| 3,626,289 | 12/1971 | Vinson | 324/133 |
| 3,746,984 | 7/1973 | Cerveny | 324/133 |
| 3,806,803 | 4/1974 | Hall | 324/133 |
| 3,934,195 | 1/1976 | Shires | 324/72.5 |
| 4,027,236 | 5/1977 | Stewart | 324/51 |
| 4,028,621 | 6/1977 | Bloxham | 324/51 |
| 4,041,380 | 8/1977 | Epstein | 324/51 |
| 4,145,651 | 3/1979 | Ripingill, Jr. | 324/72.5 |
| 4,171,512 | 10/1979 | Tsuda | 324/133 |
| 4,361,800 | 11/1982 | Fodali et al. | 324/53 |
| 4,366,434 | 12/1982 | Ellis | 324/51 |
| 4,504,781 | 3/1985 | Hargrove | 324/72.5 |
| 4,510,572 | 4/1985 | Reece et al. | 364/489 |
| 4,540,940 | 9/1985 | Nolan | 324/133 |
| 4,634,971 | 1/1987 | Johnson et al. | 324/489 |
| 4,656,416 | 4/1987 | Brasfield | 324/133 |
| 4,724,382 | 2/1988 | Schauerte | 324/133 |
| 4,740,745 | 4/1988 | Sainz | 324/133 |
| 4,859,932 | 8/1989 | Whitley | 324/133 |
| 4,924,177 | 5/1990 | Mulz | 324/133 |
| 4,999,574 | 3/1991 | Stephens | 324/133 |
| 5,285,163 | 2/1994 | Liotta | 324/133 |

FOREIGN PATENT DOCUMENTS

WO89/06365  7/1989  WIPO .................. 324/133

*Primary Examiner*—Maura K. Regan
*Attorney, Agent, or Firm*—Standley & Gilcrest

[57] ABSTRACT

A hand held electrical circuit testing for use by technicians to determine circuit conditions such as, whether a duty cycle is present or whether constant voltage is present. The invention makes use of three visual indicating means within a clear body portion of the device which reveal a lighting pattern that will provide an experienced technician with information to determine the circuit condition.

3 Claims, 6 Drawing Sheets

CIRCUIT TESTING DEVICE

BACKGROUND AND SUMMARY OF THE INTENTION

The present invention relates generally to electrical testing devices and, more particularly to hand-held devices for testing electrical circuits, wires and the like.

Prior electrical testing devices include single function test devices. These devices typically include a single probe needle or the like extending from one end of the device and a single lead wire extending from the other end of the device. A clip, such as an alligator clip is typically joined to the lead wire and the clip is typically connected to a ground. Thus, when a circuit is probed by the probe needle, a two point connection to the circuit is established.

There are problems with these single function test devices. First, it is often difficult to tell whether the connection to the ground is a good connection. Often, there may be paint, corrosion, rust, etc. built up on the ground and this could prevent good contact between the clip and the ground. In some of these single function test devices it is difficult to distinguish between an open circuit and a grounded circuit. Second, the two point connection of these single function test devices can only give an indication of one circuit condition at a time.

Other known devices include probes for high speed computer applications and oscilloscopes which are also used to measure a signal. These devices are complicated to understand. They also require time consuming hook-up, and expensive equipment generally impractical for use by an automotive technician.

The present invention is designed to check the automotive grade on electronic signals, to be easy to apply, to be relatively inexpensive, and to be easy to interpret output results from the tester. The present invention would be practically useful in checking the frequencies and duty cycle signals from on-board computers or frequency generators. The present invention uses electronic circuitry to detect a changing voltage condition where the voltage signal is changing from the zero voltage state, to the zero voltage state, or is passing through the zero voltage state.

The present invention provides a circuit testing device comprising a body having first and second ends, the body having an electrical circuit or other circuit means contained therein, a probe communicating with the electrical circuit means and extending from the first end of the body, a first power lead having a first end communicating with the electrical circuit means and extending from the second end of the body, a second power lead having a first end communicating with the electrical circuit means and extending from the second end of the body, and preferably a third power lead having a first end communicating with the electrical circuit means and extending from the second end of the body.

In one preferred embodiment of the invention a method exists for measuring low voltage and pulse signals of a test element such as a circuit or wire, comprising the steps of connecting a first lead extending from an electrical circuit of a polarity testing device to a power source, connecting a second lead extending from the electrical circuit testing device to a ground source, and contacting a probe extending from the electrical circuit of the polarity device with a circuit or wire to determine the polarity of the circuit or wire.

Another preferred feature of the present invention is the ability to test more than one circuit condition at a given time.

Other principal features and advantages of the present invention will become apparent to those skilled in the art upon review of the following detailed description, claims, and drawings.

Figure 1:
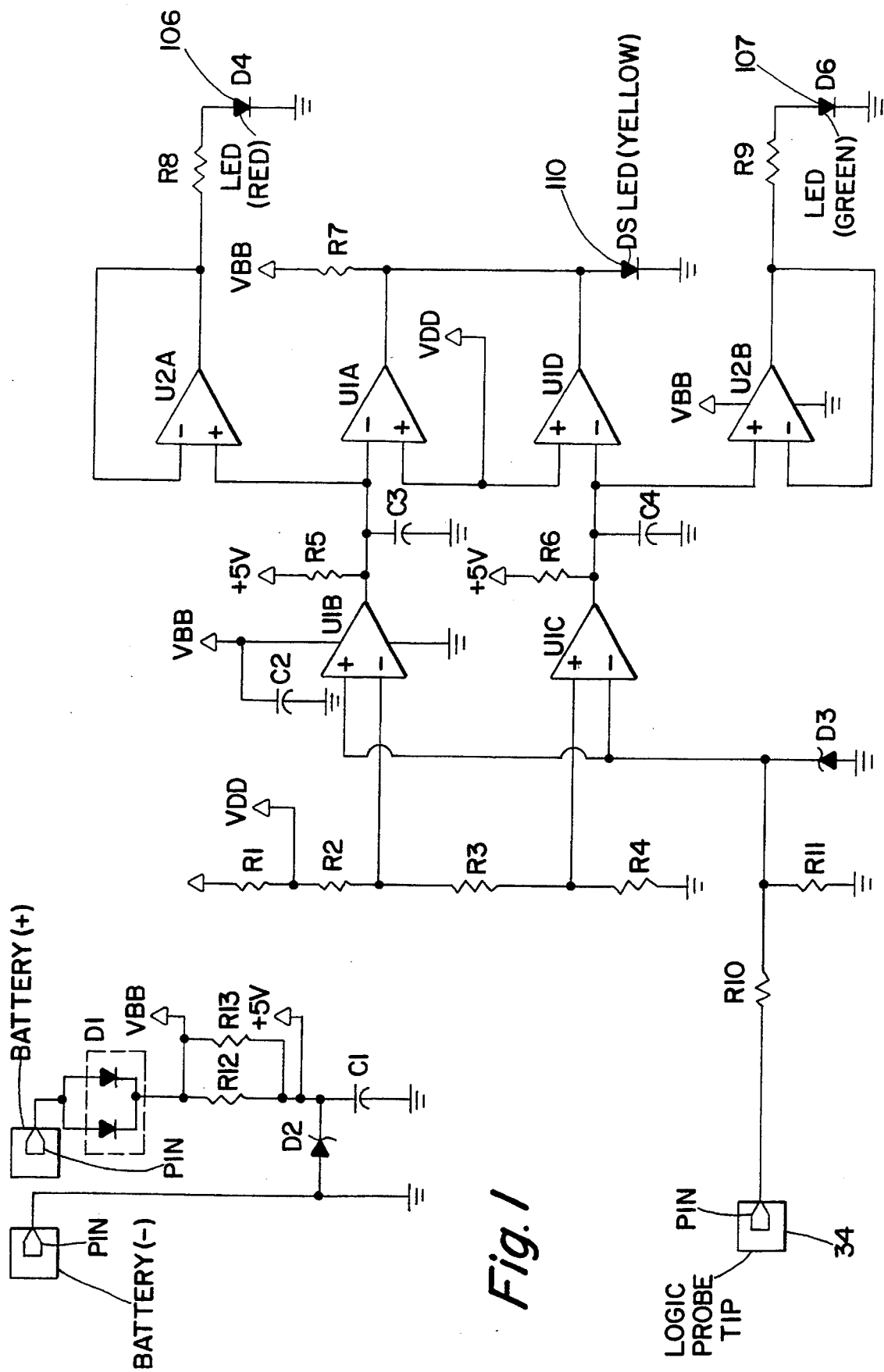
FIG. 1 is a schematic circuit diagram of one embodiment of the present invention.

Before one embodiment of the invention is explained in detail, it is to be understood that the invention is not limited in its application to the details of construction and the arrangement of components set forth in the description or illustrated in the drawings. The invention is capable of other embodiments and of being practiced or carried out in various ways. Also, it should be understood that the phraseology and terminology used herein is for the purpose of description and should not be regarded as limiting.

DESCRIPTION OF THE PREFERRED EMBODIMENTS

A logic tester device 10 embodying the invention is illustrated in the drawings. Typical applications for use of the present invention include, but are not limited to, automotive, marine and aircraft equipment. For example, the ignition systems in use in the automotive industry today have circuits which require TTL pulse testing. The amplitude of the majority of these circuits is between zero and 7 volts, while the frequency for the majority of the circuits is well below 4 kHz. Ordinarily, a minimum pulse that would be measured is one microsecond. The present invention is well suited for testing over these ranges.

Another use for the present invention is to check the operation of a number of magnetic pulse generators. These units typically operate at a frequency between 10 Hz and 2 kHz at an approximate amplitude of 0.2 to 300 volts.

The present invention will allow a technician to quickly test many of the engine control computer, ignition and anti-lock brake components that produce a frequency-type output signal. Some specific examples of use of the present invention would be in testing pickup coils, Hall effect switches, tach reference circuits, frequency generating sensors, anti-lock brake speed sensors, and computer trouble codes. Other features of the present invention include: it is capable of sensing very low voltages; it accomplishes its objective without excessively loading the circuit it is testing; it is capable of testing for AC and DC signals; it indicates power, ground, and pulses; a power on light verifies connections; and, it comes within a durable housing.

The circuit testing device 10 of the present invention is designed to test circuits of an amplitude preferably between 0 and about 20 volts and a frequency below 20 kHz. But, circuits of amplitudes outside of this preferred range may also be tested with the present invention. The device 10 is comprised of a body portion 14 having a first-end 18 and a second end 22. The body 14 contains an electrical circuit or circuit means, such as circuit board 26, which is illustrated schematically in FIGS. 2 and 3 and which will be discussed in greater detail below. The body 14 is preferably formed of a transparent material, such as cellulose acetate, so that three light emitting diodes (LEDs) on the circuit board 26 will be visible through the body 14.

A metal probe 30 extends from the first end 18 of the body 14. The probe 30 has a tip 34 which is pressed against a selected circuit point to be tested. The probe 30 is connected at the end opposite the tip to a contact on the circuit board by any suitable means known to those of ordinary skill in the art.

First, second and third power lead wires 38, 39 and 42 extend from the second end 22 of the body 14. The first power lead 38 has a first end 46 and a second end 50. The first end 46 of the first power lead 38 is connected to a terminal on circuit board 26 by a terminal clip 54. While the second end 50 of the first power lead 38 includes clip means, such as alligator clip 58, attached thereto which is to be connected to the circuit power source. A protective red boot 62 may be attached to the first power lead 38.

The second power lead 39 has a first end 47 and second end 51. The first end 47 of the second power lead 39 is connected to a terminal on circuit board 26 by a terminal clip 55. While the second end 51 of the second power lead 39 includes clip means, such as alligator clip 59, attached thereto which is to be connected to the circuit power source. A protective white boot 63 may be attached. To the second power lead 39.

The third power lead 42 likewise has a first end 66 and second end 70. The first end 66 of the third power lead 42 is connected to a terminal on the circuit board 26 by a terminal clip 74 while the second end 70 of the third power lead 42 includes clip means, such as alligator clip 78, attached thereto which is to be connected to a group source. A protective black boot 82 may be attached to the second power lead 42.

A cap 86 and bushing 90 preferably enclose the second end 22 of the body 14. The first, second and third power leads 38, 39 and 42 extend through the cap 86 and bushing 90 and through a tapered spring 94 as they exit the second end 22 of the body 14.

Figure 2:
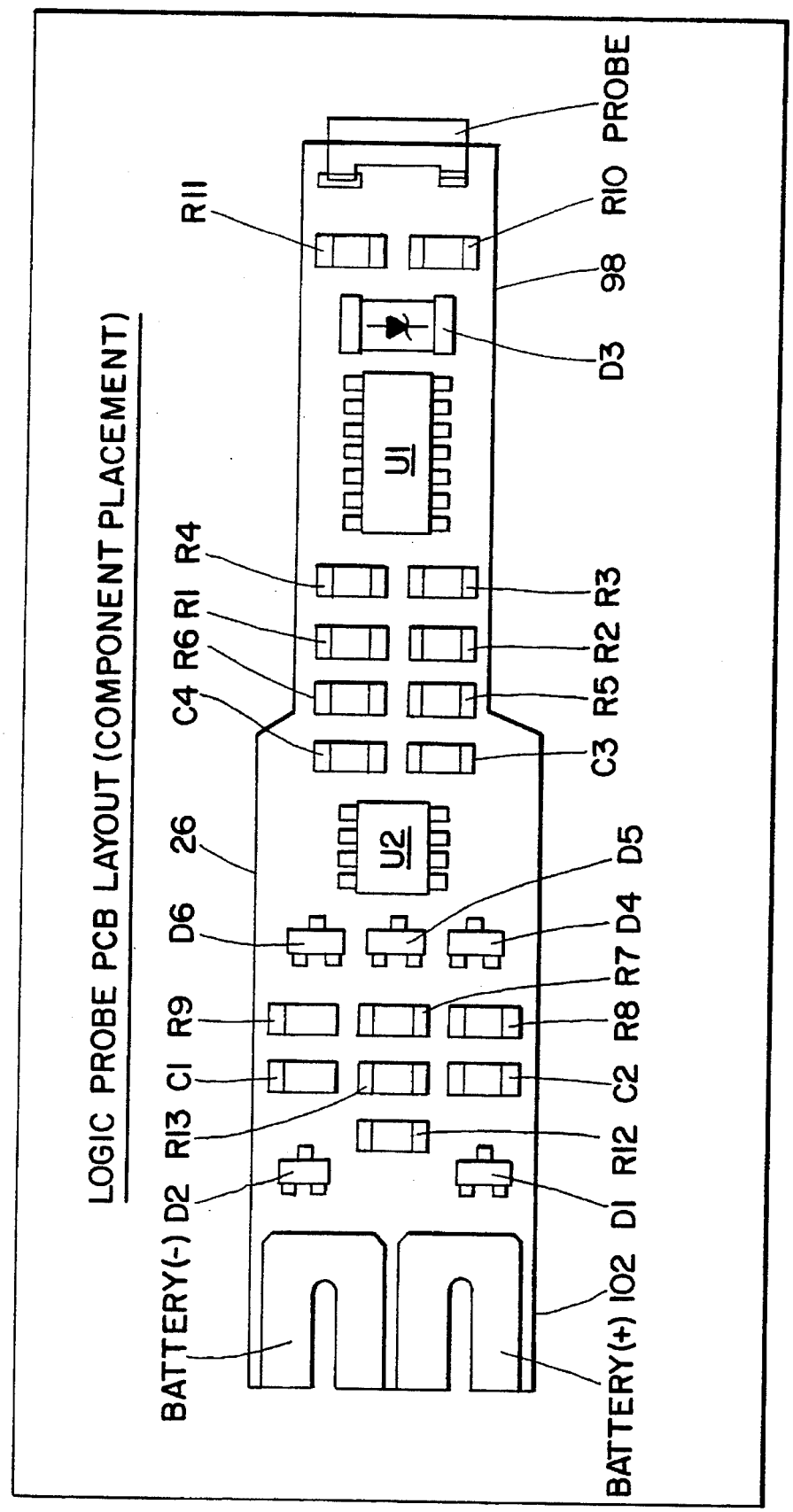
FIG. 2 is a plan view of the printed circuit board (PCB) layout of the present invention.
Figure 3:
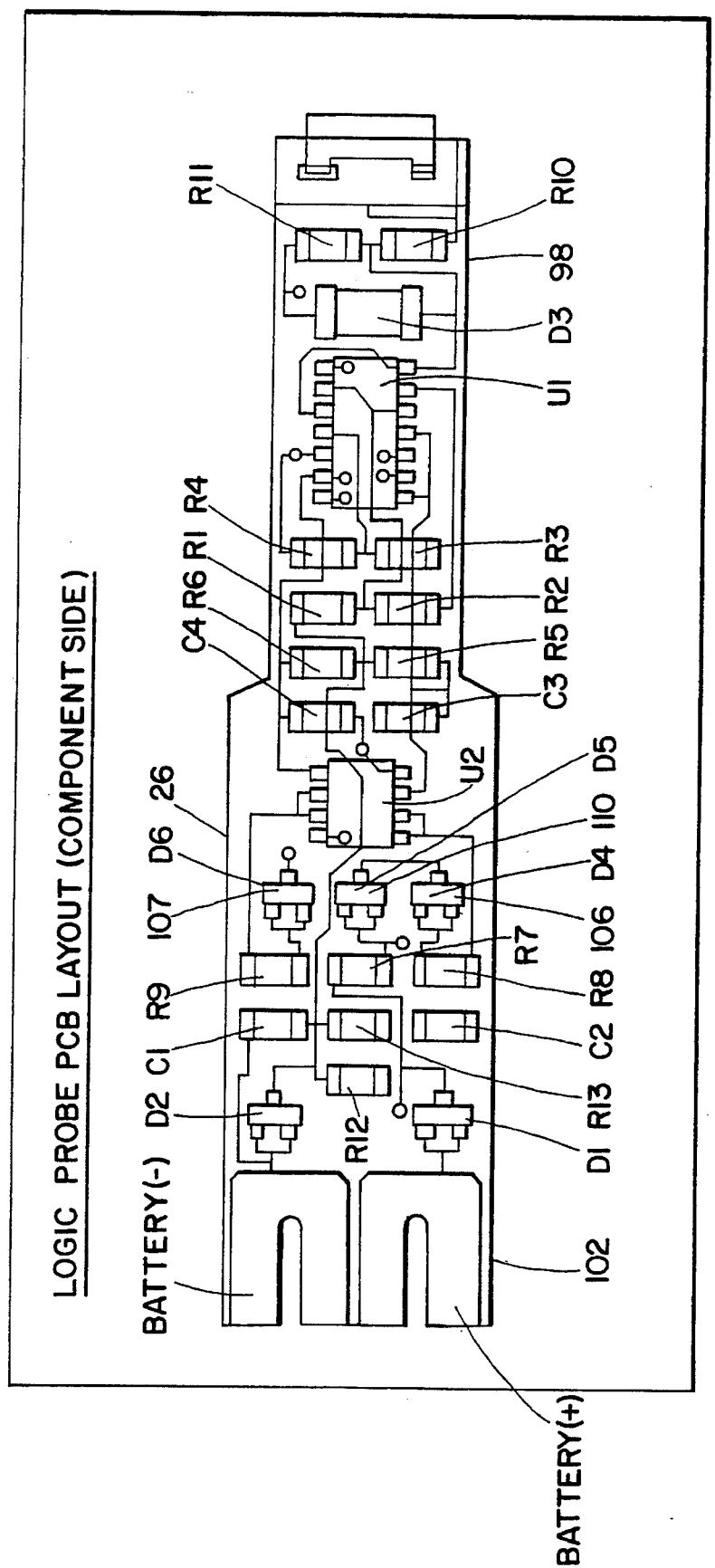
FIG. 3 is a more detailed view of the PCB layout shown in FIG. 2.
Figure 4:
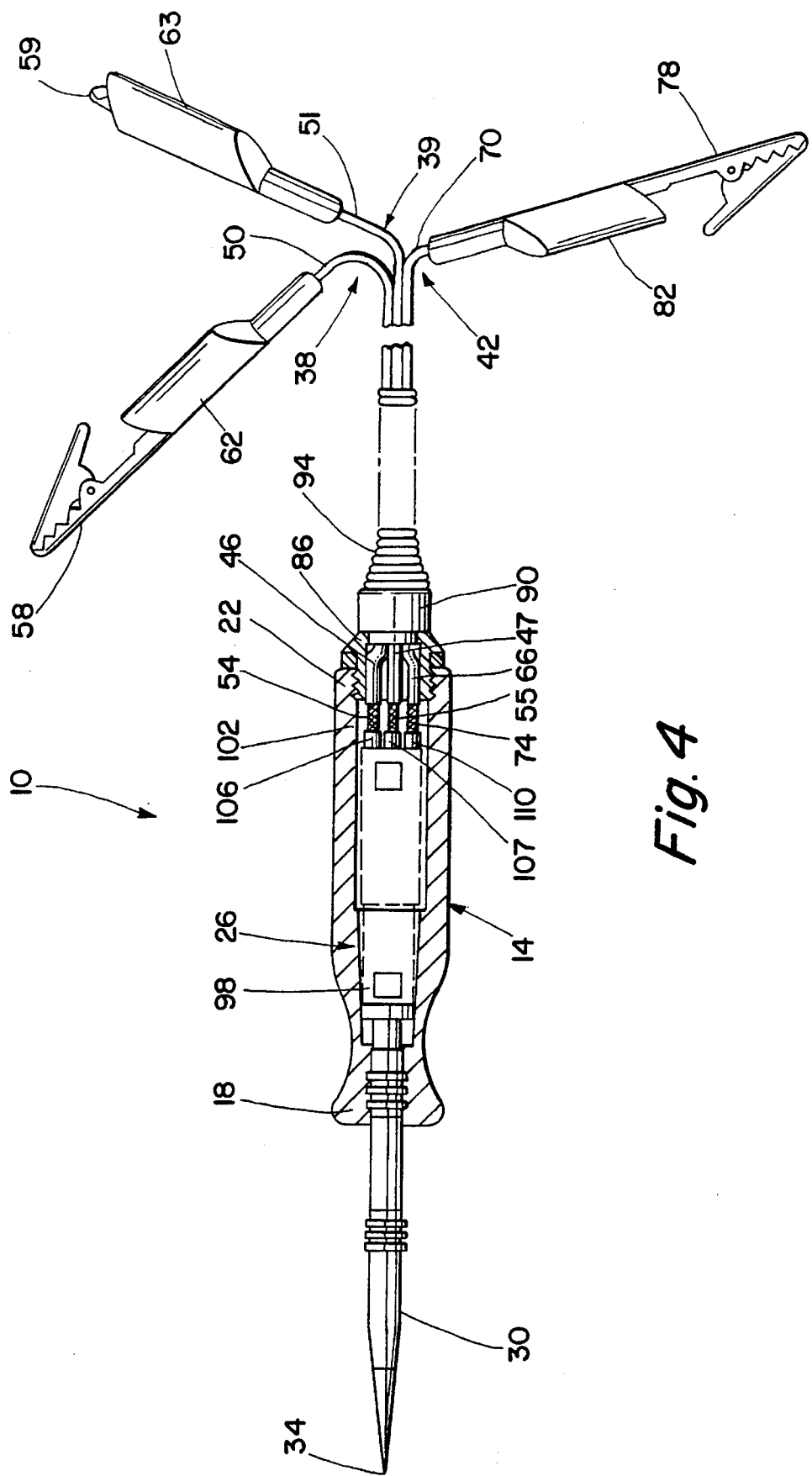
FIG. 4 is a plan view of the device of the present invention.

The circuit board 26 of the present invention is illustrated in FIGS. 2 and 3. As the circuit board 26 is positioned in the body 14 of the device 10, the circuit board 26 has a first end 98 associated with the probe 30 and a second end 102 associated with the power leads 38, 39 and 42.

The circuit board 26 includes visual indicator means such as first, second, and third LEDs, 106, 107, and 110. These LEDs are preferably red, green and yellow color LEDs respectively. FIG. 3 shows the preferred arrangement and relationships of and between the components which reside on the circuit board 26. The components identified by an "R" prefix in front of a numerical reference are resistors. Those components identified with a "C" prefix followed by a numerical reference are capacitors. The component identified as "D1" is preferably a diode. The components identified as "D2" and "D3" are both preferably zener diodes. Item "D4" is preferably a red light emitting diode. Item "D5" is preferably a yellow light emitting diode. Item "D6" is preferably a green light emitting diode. Item "U1" is preferably an IC quad comparator. Item "U2" is preferably an IC dual operational amplifier.

Referring to FIG. 1, a schematic circuit diagram which may be used to understand one embodiment of the present invention is shown. The components are numbered identically to those components shown in FIGS. 2 and 3. Starting at the upper left of FIG. 1, the "Battery (+)" lead may be connected to a power source. The "Battery (−)" lead may be connected to a ground. The voltage across these two leads may be applied to a voltage divider network which may comprise a network of resistors. The voltage divider network may provide a series of constant reference voltages available at locations across the voltage divider network. For instance, a first constant reference voltage may be seen below resistor "R2", a second constant reference voltage may be available below resistor "R3" and a third constant reference voltage may be available below resistor "R1". This particular embodiment applies the first constant reference voltage to a first comparator circuit which includes a first op-amp identified as "U1B", the second constant reference voltage to a second comparator circuit which includes a second op-amp identified as "U1C", and the third constant reference voltage to third and fourth comparator circuits that include third op-amp "U1A" and fourth op-amp "U1D", respectively.

At the bottom left of FIG. 1, logic probe tip 34 is applied to a circuit point to receive an input signal from the circuit undergoing testing. This input signal is applied to both first and second comparator circuits. The comparators then compare the input signal to their respective constant reference voltage. In the present embodiment, the first comparator circuit will have a first output when the first constant reference voltage is less than the high state of the input signal and a second output when the first constant reference voltage is higher than the low state of the input signal. Similarly, second comparator circuit will provide a third and fourth output depending upon whether the input signal is higher or lower than the second constant reference voltage.

In the present embodiment, the output signals of the first and second comparator circuits are applied to first and second RC networks, respectively. In turn, the first and second RC networks apply their outputs to the third and fourth comparator circuit, respectively. The third and fourth comparator circuits serve to provide a brief flash of the LED (YELLOW) when the input signal transitions from a high state to a low state or a low state to a high state.

First and second RC networks may also apply their outputs to voltage follower networks which may include fifth "U2A" and sixth "U2B" op-amps respectively. The voltage follower network which includes "U2A", illuminates LED (RED) when the first comparator circuit sends a first output signal. The voltage follower network which includes "U2B", illuminates LED (GREEN) when the second comparator circuit sends the fourth output signal.

In operation, the alligator clip 58 of the first lead 38 is connected to a ground source and the alligator clip 78 of the second lead 39 is connected to a power source. When the connections are made properly, the power LED 107 will be green.

After a good ground connection is established (using either ground lead 39, or extra ground lead 42 in situations where the component being tested is not connected to a standard ground), the tip 34 of the probe 30 is pressed against a selected circuit point, wire, or the like, to be tested. The probe 30 may be utilized with either a positively grounded electrical system or a negatively grounded electrical system. If on, the red LED 106 indicates a constant voltage is present. If the yellow LED 110 is on, it indicates the presence of a duty cycle in the circuit. A duty cycle occurs when the voltage is cycling between on and off or low and high conditions.

Stated in another way, the green LED indicates that the tester is properly connected and there is no voltage or signal applied to the tip of the probe. The yellow LED indicates that there is a changing voltage signal at the tip. The red LED shows that a steady voltage level is being applied to the tip of the probe. The tester of the present invention can indicate constant voltage levels from about 1 volt to as high as about 20 volts. The present invention is capable of sensing both analog or AC signals as well as digital or DC types in a frequency range from about 2 Hz to about 20 kHz.

The term duty cycle refers to the percentage of each cycle the signal is low or grounded compared to the percentage it is high or open. Most inputs to a computer have a constant duty cycle. The computer turns on devices by pulling their circuits to ground. To control a device gradually, such an EGR solenoid or fuel injector, the computer alters the duty cycle. A low (20%) duty cycle indicates the device is barely on. As the duty cycle increases, the device operates with more output. At 100% duty cycle the device is at full output.

Figure 5A:
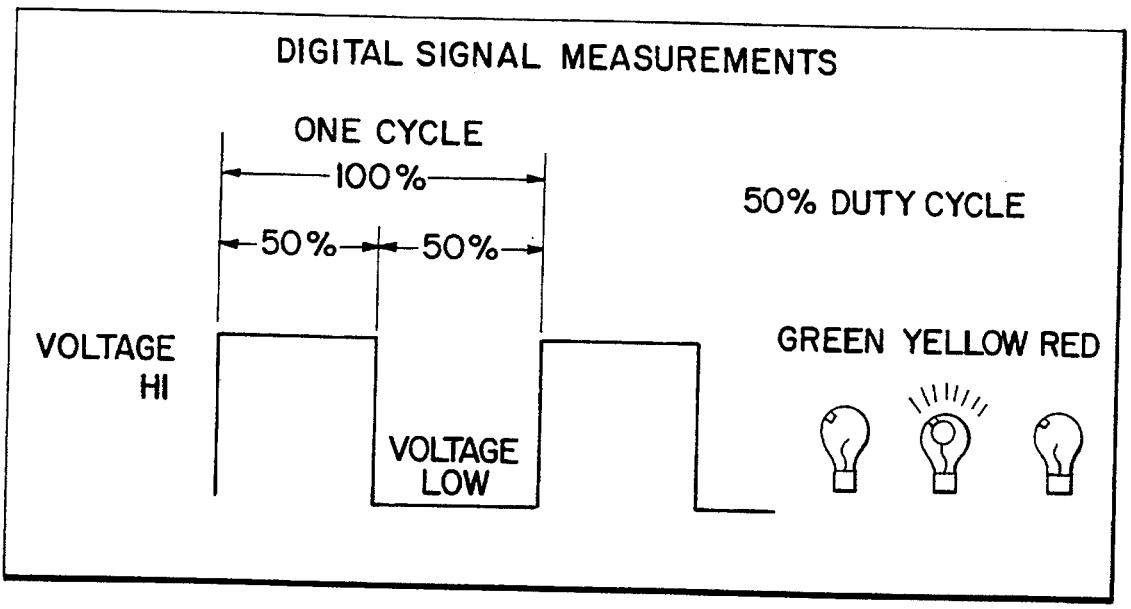
FIGS. 5A–5C show the lighting patterns of the three light sources of the present invention under particular duty cycles for digital signals.
Figure 5B:
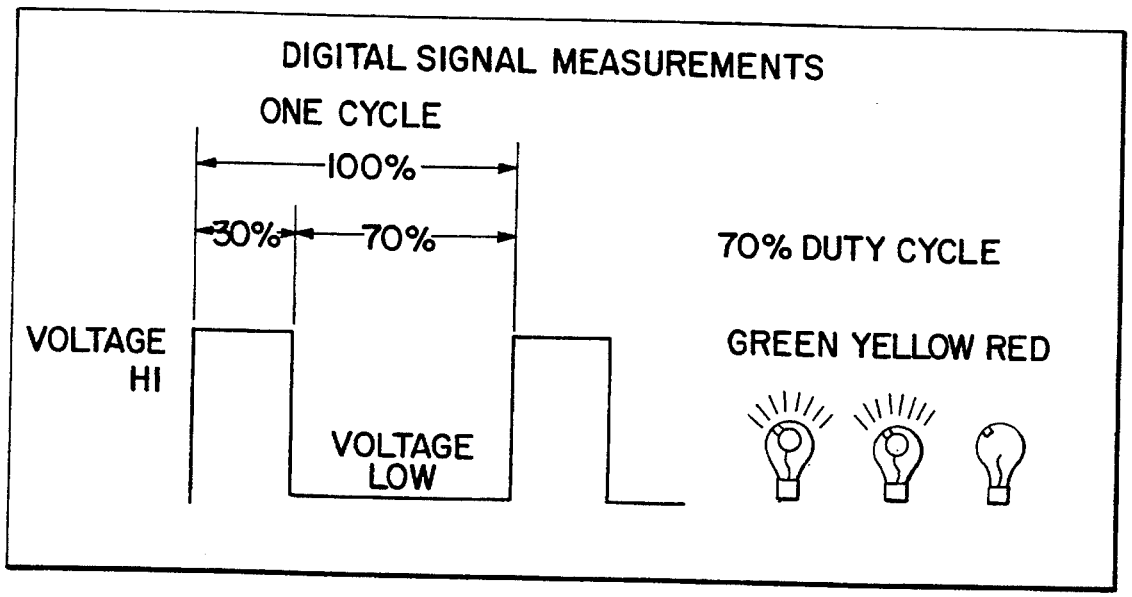
Figure 5C:
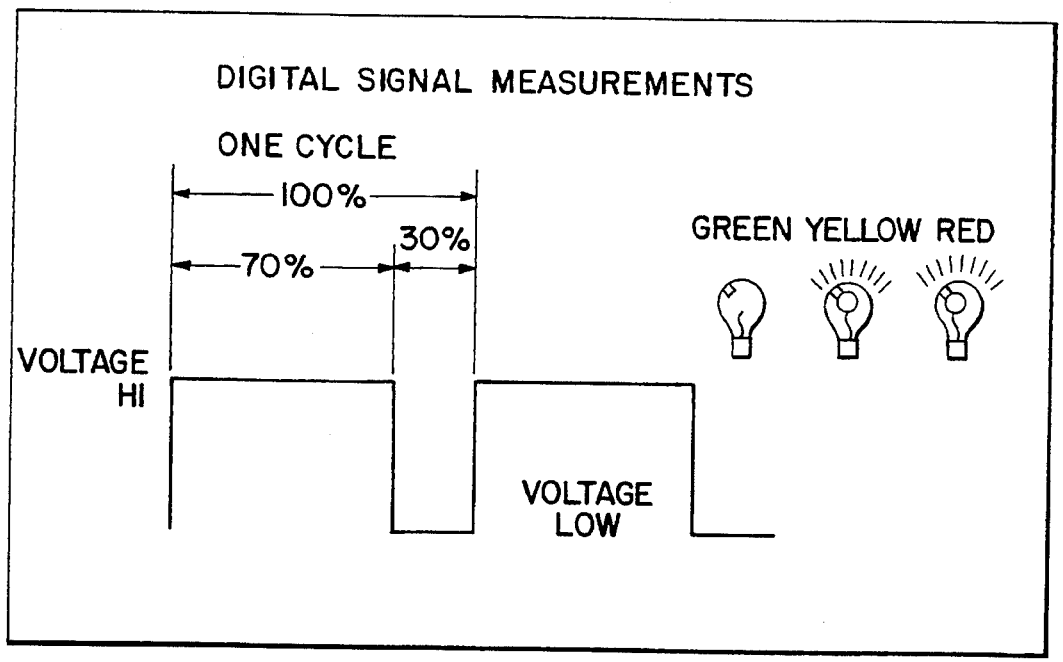
Figure 6:
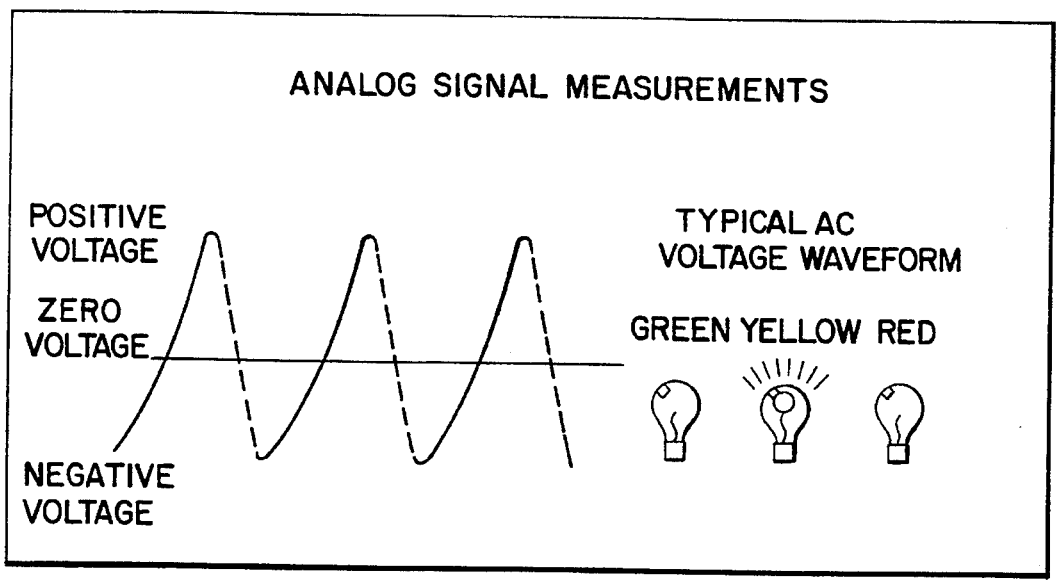
FIG. 6 shows a lighting pattern of the three light sources of the present invention under a typical AC voltage waveform.

The present invention further enables a technician to determine the varying degrees of a duty cycle by visual examination of the three LEDs 106, 107, and 110. For example, as shown in FIG. 5A, a 50% duty cycle would reveal a yellow light. As shown in FIG. 5B, a 70% duty cycle would reveal both a green and yellow light. As shown in FIG. 5C, a 30% duty cycle would reveal both a yellow and red light. Because the tester of the present invention is capable of countless lighting patterns with respect to the three LEDs, (by variations in the flicker (if any of each light source) the experienced technician will be able to recognize a given light pattern as being representative of a particular duty cycle. FIG. 6 reveals that the yellow LED will be on during a typical AC voltage waveform.

Various features of the invention are set forth in the following claims.

What is claimed is:

1. A method for testing a circuit condition of a point in a circuit, comprising the steps of:

connecting a first lead extending from a voltage divider network to a power source;

connecting a second lead extending from said voltage divider network to a ground source;

providing a first constant reference voltage from said voltage divider network to a first op-amp in a first comparator circuit arrangement;

providing a second constant reference voltage from said voltage divider network to a second op-amp in a second comparator circuit arrangement;

providing a third constant reference voltage from said voltage divider network to a third op-amp in a third comparator circuit arrangement;

providing said third constant reference voltage from said divider network to a fourth op-amp in a fourth comparator circuit arrangement;

contacting a probe to a selected circuit point to be tested to provide an input signal to said first and second comparator circuit arrangement;

providing a first output signal from said first comparator circuit through a first RC network to said third comparator circuit and a fifth op-amp circuit in a voltage follower arrangement when said first constant reference voltage is less than the high state of said input signal;

providing a second output signal from said first comparator circuit through said first RC network to said third comparator circuit and said fifth op-amp circuit when said first constant reference voltage is higher than the low state of said input signal, wherein said third comparator circuit is referenced to said third constant reference voltage;

illuminating a first LED when said first comparator circuit transitions from sending said first output signal to sending said second output signal to said third comparator circuit;

illuminating a second LED when said fifth op-amp circuit receives said first output signal from said first comparator circuit;

providing a third output signal from said second comparator circuit through a second RC network to said fourth comparator circuit and a sixth op-amp circuit in a voltage follower arrangement when said second reference voltage is less than the high state of said input signal;

providing a fourth output signal from said second comparator circuit through said first RC network to said fourth comparator circuit and said sixth op-amp circuit when said second constant reference voltage is higher than the low state of the input signal, wherein said fourth comparator circuit is referenced to said third constant reference voltage;

illuminating said first LED when said second comparator circuit transitions from sending said third output signal to sending said fourth output signal to said fourth comparator circuit;

illuminating a third LED when said fourth input signal from said second comparator is provided to said sixth op-amp circuit.

2. The method of claim 1, further comprising:

analyzing the lighting pattern of said red, yellow and green LEDs to determine a percentage duty cycle of said circuit being tested.

3. A circuit testing device comprising:

a body having first and second ends, said body having electrical circuit means contained therein;

a probe communicating with said electrical circuit means and extending from said first end of said body;

a first power lead having a first end communicating with said electrical circuit means and extending from said second end of said body;

a second power lead having a first end communicating with said electrical circuit means and extending from said second end of said body;

first, second and third visual indicating means in association with said electrical circuit means for providing an indication of a circuit condition;

a voltage divider network in communication with said first and second power leads for generating three reference voltages;

a first comparator in communication with said voltage divider network for receiving a first of said reference voltages and also in communication with said probe for receiving an input signal therefrom;

a second comparator in communication with said voltage divider network for receiving a second of said reference voltages and also in communication with said probe for receiving an input signal therefrom;

a third comparator in communication with the output of said first comparator and also in communication with said voltage divider network for receiving a third of said reference voltages, wherein said third comparator is also in communication with said first visual indicator means;

a fourth comparator in communication with the output of said second comparator and also in communication with said voltage divider network for receiving said third of said reference voltages, wherein said fourth comparator is also in communication with said first visual indicator means;

a first voltage follower network in communication with the output of said first comparator and in communication with said second visual indicator means; and a second voltage follower network in communication with the output of said second comparator and in communication with said third visual indicator means.

* * * * *